United States Patent [19]

Tada

[11] Patent Number: 5,374,849
[45] Date of Patent: Dec. 20, 1994

[54] CONDUCTIVE LAYER CONNECTION STRUCTURE OF SEMICONDUCTOR DEVICE

[75] Inventor: Kenichi Tada, Hyogo, Japan

[73] Assignee: Mitsubishi Denki Kabushiki Kaisha, Tokyo, Japan

[21] Appl. No.: 26,672

[22] Filed: Mar. 1, 1993

[30] Foreign Application Priority Data

Mar. 2, 1992 [JP] Japan .................. 4-044827

[51] Int. Cl.$^5$ ................ H01L 29/40; H01L 29/60; H01L 29/62
[52] U.S. Cl. .................. 257/751; 257/752; 257/763; 257/773
[58] Field of Search .......... 257/751, 752, 763, 758, 257/757, 764, 767, 773

[56] References Cited

U.S. PATENT DOCUMENTS 5,084,413 1/1992 Fujita et al. .............. 257/763

FOREIGN PATENT DOCUMENTS 0244772 10/1988 Japan .................. 257/751
0134849 5/1990 Japan .................. 257/751
0292765 12/1991 Japan .................. 257/751

OTHER PUBLICATIONS

R. de Werdt et al., "A 1M SRAM with Full CMOS Cells Fabricated in A 0.7 $\mu$M Technology", 25.1, IEDM 532-535, 1987, Philips Research Laboratories, The Netherlands.

"Magnetically-Enhanced Etching for Tungsten Contact Plug Fabrication", by Angelo Selino et al, Mat. Res. Soc. Symp. Proc. VLSIV, Materials Research Society, 1990.

Primary Examiner—Rolf Hille
Assistant Examiner—Peter Toby Brown
Attorney, Agent, or Firm—Lowe, Price, LeBlanc & Becker

[57] ABSTRACT

A difference in level between a tungsten film and a barrier metal film is inevitably caused by the formation of barrier metal film and tungsten film in a through-hole. A tungsten film is formed to eliminate this difference in level. Tungsten film is embedded in an opening region surrounded by the sidewall of through-hole, an upper surface of barrier metal film and an upper surface of tungsten film. Therefore, the connection between an aluminum film and tungsten film cannot be broken by the expansion of the air in the space portion even through the step involving heat treatment.

7 Claims, 21 Drawing Sheets

CONDUCTIVE LAYER CONNECTION STRUCTURE OF SEMICONDUCTOR DEVICE

BACKGROUND OF THE INVENTION

1. Field of the Invention

The present invention relates to a conductive layer connection structure of semiconductor memory device electrically connecting an upper conductive layer and a lower conductive layer and, more particularly, to a conductive layer connection structure having a barrier metal layer and a manufacturing method thereof.

2. Description of the Background Art

FIG. 10 is a block diagram of a conventional semiconductor memory device. A silicon substrate 1 includes a memory cell region and a region of a peripheral circuit.

FIG. 11 is an enlarged plan view of the semiconductor memory device shown in FIG. 10. This semiconductor memory device is a DRAM (Dynamic Random Access Memory). A field oxide film 5 is formed on the silicon substrate. Word lines 9a, 9b, 9c, 9d, a gate electrode line 10 and aluminum films (bit lines) 29a, 29b and 29c are formed on the silicon substrate at intervals. 11 denotes a storage node. A cell plate is not shown.

FIG. 12 is a sectional view showing a state of FIG. 11 broken from the direction of an arrow. Impurity regions 3a, 3b and 3c are formed on a main surface of silicon substrate 1 at intervals. 5 denotes a field oxide film. Word lines 9a, 9b, 9c, 9d and gate electrode line 10 are formed on silicon substrate 1 at intervals. These wiring layers are covered with a silicon oxide film 17.

Storage node 11 is electrically connected with impurity region 3a. A dielectric film 13 is formed on the surface of storage node 11. A cell plate 15 is formed on the surface of dielectric film 13. A silicon oxide film 19 is formed on silicon substrate 1 to cover cell plate 15.

A through-hole 23a extending to impurity region 3b is formed in silicon oxide film 19. A barrier metal film 25a is formed on the sidewall of through-hole 23a and also on impurity region 3b in through-hole 23a. A tungsten film 27a is formed on barrier metal film 25a to fill through-hole 23a. Aluminum film 29a is connected with tungsten 27a. A void 31 is formed between barrier metal film 25a and aluminum film 29a.

Similar structure is formed also on impurity region 3c. 23b denotes a through-hole, 25b a barrier metal film, 27b tungsten, 29b an aluminum film and 31 a void. A method of connecting aluminum film 29a and impurity region 3b will be explained hereinafter.

As shown in FIG. 13, silicon oxide film 19 is selectively removed through the etching by using a resist 21 as a mask to form through-holes 23a and 23b on impurity regions 3b and 3c.

As shown in FIG. 14, a barrier metal film 25 is formed by the sputtering method or the CVD method. A tungsten film 27 is formed on barrier metal film 25 by using the CVD method. Since the thickness of barrier metal film 25 is small, it can be formed by the sputtering method. One reason for the formation of barrier metal film 25 is described as in the following; Tungsten enters impurity region 3b by the mutual diffusion when tungsten film 27 and impurity region 3b are in direct connection, which is referred to as an alloy spike phenomenon. If the tungsten entered into impurity region 3b by the alloy spike phenomenon is further increased to extend to silicon substrate 1, a PN junction between silicon substrate 1 and impurity region 3b is broken. The break of the PN junction causes the problems of the generation of the current leak or the like. Therefore, barrier metal film 25 prevents tungsten film 27 from diffusing into impurity region 3b.

The other reason for forming barrier metal film 25 is to improve a bad adhesion between silicon oxide film 19 and tungsten film 27. Barrier metal film 25 has a good adhesion with silicon oxide film 19 and tungsten 27.

Now, return to the explanation of the method. As shown in FIG. 15, by using the etching method in which an etching rate of tungsten film 27 is greater than that of barrier metal film 25 (for example, anisotropic etching by F group gas). Etching is applied to the overall surface of tungsten film 27 so that the tungsten film can remain only in through-holes 23a and 23b (FIG. 14). However, tungsten film 27c is left unetched in spite of the overall etching of the tungsten film 27 (FIG. 15). The tungsten in through-hole 23a is hereinafter referred to as 27a. The tungsten in through-hole 23b is referred to as 27b.

27c is left unetched at the time of the overall etching of the tungsten. Referring to FIG. 14, in tungsten film 27, the portion indicated by A and that indicated by B are different in thicknesses. The etching of tungsten film 27 can be stopped at the entrances of through-holes 23a and 23b as shown in FIG. 15 by etching tungsten film 27 on the basis of the thickness denoted by A. However, since the portion denoted by B (See FIG. 14) is thicker than the denoted by A (See FIG. 14), a part of the tungsten film is left on the portion indicated by B.

As shown in FIG. 16, tungsten films 27a, 27b and 27c are etched to remove tungsten film 27c. Therefore, the upper surface of tungsten film 27a is lower than the entrance of through-hole 23a, and so is tungsten film 27b.

As shown in FIG. 17, by using the etching method (for example, an anisotropic etching by $Cl_2$ group gas) in which the etch rate of barrier metal film 25 is larger than that of tungsten films 27a and 27b, the entire surface of barrier metal film 25 is etched with barrier metal films 25 in through-holes 23a and 23b being left. The barrier metal films in through-holes 23a and 23b are referred to as 25a and 25b, respectively. 25c denotes the barrier metal film. Barrier metal film 25c is generated in the same way as in the case of the tungsten film described above. That is, as shown in FIG. 16, in barrier metal film 25, the portion denoted by C and that denoted by D are different in thicknesses. Therefore, if barrier metal film 25 is etched on the basis of the portion denoted by C, barrier metal film 25 in the portion denoted by D is not completely etched away, whereby, a part of barrier metal film 25 is left.

The barrier metal film is further etched away to remove barrier metal film 25c as shown in FIG. 18. E denotes a distance between the entrance of through-hole 23a and the upper surface of tungsten film 27a. F denotes a distance between the entrance of through-hole 23a and the upper surface of barrier metal film 25a.

The fact that the distance denoted by F is longer than that denoted by E is caused by two reasons set forth as in the following. One is caused by a loading effect. The loading effect is a phenomenon in which the etch rate becomes lower as the area to be etched becomes larger. The etched areas of tungsten films 27a and 27b are much larger than those of barrier metal films 25a and 25b. Therefore, the etched amount of barrier metal films 25a and 25b in a vertical direction until barrier metal film 25c is etched away is larger than the etched amount of tungsten films 27a and 27b in a vertical direction until tungsten film 27c is etched away. The other is caused by the etching of barrier metal film 25 using an etching method in which the etch rate of barrier metal film 25 is larger than that of tungsten films 27a and 27b.

As shown in FIG. 19, an aluminum film 29 is formed on silicon oxide film 19 by the sputtering method. An opening region surrounded by the upper surface 28 of the tungsten film 27a, the upper surface 26 of barrier metal film 25a and the sidewall of through-hole 23a is small. Accordingly, if the sputtering method is adopted for forming aluminum layer 29, the aluminum cannot enter the space, with the result that void 31 is formed.

As shown in FIG. 12, a predetermined patterning is effected on aluminum film 29. The method electrically connecting the aluminum film and an impurity diffusion layer by using the barrier metal film and the tungsten film formed by the CVD method is disclosed, for example, in "MAGNETICALLY-ENHANCED ETCHING FOR TUNGSTEN CONTACT PLUG FABRICATION" Mat. Res. Soc. Symp. Proc. VLSIV. 1990 Materials Research Society.

The reason why tungsten 27a, instead of aluminum, is formed in through-hole 23a will be explained hereinafter. Aluminum is preferably formed in the through-hole since resistance of aluminum is smaller than that of tungsten. Due to the miniaturization of the semiconductor memory device, an aspect ratio of the through-hole (a depth of the through-hole/an opening dimension of the through-hole) tends to be increased. In the formation of conductive film by the sputtering method, a gap occurs in the conductive film as the aspect ratio becomes larger.

FIG. 20 is a diagram showing a state of the formation of an upper conductive layer 41 by using the sputtering method. 35 denotes a lower conductive layer, 37 an interlayer insulating layer and 39 a through-hole.

On the sidewall of through-hole 39, at the portion (A) sputtered conductive material is easily attached, while at the portion (B) sputtered conductive material is hardly attached. In other words, the formation rate of upper conductive layer at the portion (A) is larger than that at the portion (B). Therefore, a gap 43 is generated as shown in FIG. 21 after the formation process of the upper conductive layer under this condition. Gap 43 causes an increase in a resistance value of upper wiring layer 41 in through-hole 39.

Aluminum film can be formed only by the sputtering method. When the aspect ratio of the through-hole is large, the gap is generated in aluminum in the through-hole after the formation of aluminum in the through-hole. Conversely, CVD can prevent the generation of the gap despite of a large aspect ratio. Tungsten can be formed by the CVD method. Tungsten is left only in the through-hole instead of being used as the upper wiring layer because of a high resistance value of tungsten.

Next, the reason why tungsten film 27c is completely removed will be described. FIG. 22 is an enlarged plan view of a semiconductor memory device with tungsten film 27c being left. A state prior to the formation of aluminum films (bit lines) 29a, 29b and 29c is shown. If tungsten film 27c is left, there may be a short of aluminum film 29a and aluminum film 29c in case of the formation of aluminum films 29a, 29b and 29c.

The air in void 31 is expanded by heat when the process involving heat treatment like silicon oxide film formation is effected with void 31 left, resulting in the break between tungsten films 27a and 27b and aluminum films 29a and 29b as shown in FIG. 23.

SUMMARY OF THE INVENTION

The present invention is made to solve conventional problems described above. An object of the present invention is to provide a manufacturing method a conductive layer connection structure of a semiconductor device capable of performing a good electric connection between the upper conductive layer and the conductive layer formed in the through-hole.

Another object of the present invention is to provide the conductive connection structure of the semiconductor device capable of performing a good electric connection between the upper conductive layer and the conductive layer formed in the through-hole.

A first aspect of the present invention is directed to manufacturing method of the conductive layer connection structure of the semiconductor device. The first aspect of the present invention includes the steps of forming an insulating layer on a lower conductive layer and having an upper main surface; forming a through-hole in an insulating layer extending to a lower conductive layer; forming a barrier metal layer on a sidewall of the through-hole, the lower conductive layer in the through-hole and the insulating layer; forming a first conductive layer on the barrier metal layer and filling the through-hole with a first conductive layer; etching away the first conductive layer so that the first conductive layer remains only in the through-hole; etching away the barrier metal layer so that the barrier metal layer remains only in the through-hole, an upper surface of the barrier metal layer in the through-hole being positioned lower from the upper main surface of the insulating layer than an upper surface of the first conductive layer in the through-hole; forming a step reducing material for reducing a difference in level between the barrier metal layer and the first conductive layer on the upper surface of the barrier metal layer in the through-hole; and forming an upper conductive layer electrically connecting with the first conductive layer on the insulating layer.

A second aspect of the present invention is directed to a manufacturing method of the conductive layer connection structure of the semiconductor device. The second aspect of the present invention includes the steps of forming an insulating layer on a lower conductive layer, the insulating layer having an upper main surface; forming a through-hole in the insulating layer to expose an upper surface of the lower conductive layer; forming a barrier metal layer on the insulating layer, a sidewall of the through-hole and the exposed upper surface of the lower conductive layer, the barrier metal layer having an upper main surface; forming a first conductive layer on the barrier metal layer and filling the through-hole; etching the first conductive layer from the upper main surface of the barrier metal layer, leaving the first conductive layer in the through-hole; etching the barrier metal layer from the upper main surface of the insulating layer, leaving the barrier metal layer in the through-hole; forming a layer of the material on the upper main surfaces of barrier metal layer and the first conductive layer in the through-hole and forming an upper conductive layer on the insulating layer and in the through-hole.

A third aspect of the present invention is directed to the conductive layer connection structure of the semiconductor device. The third aspect of the present invention includes an insulating layer having an upper main surface formed on the lower conductive layer and having a through-hole extending from the upper main surface to the lower conductive layer; a first conductive layer embedded in the through-hole and electrically connecting the upper conductive layer and the lower conductive layer; a barrier metal layer formed between the sidewall of the through-hole and the first conductive layer, and between a main surface of the lower conductive layer and a lower surface of the first conductive layer, an upper surface of the barrier metal layer in the through-hole being positioned lower from the upper main surface of the insulating layer than an upper surface of the first conductive layer; and a step reducing material formed on the upper surface of the barrier metal layer in the through-hole for reducing a difference in level from the upper main surface of the insulating layer between the upper surface of the barrier metal layer and the upper surface of the first conductive layer.

According to the first aspect of the present invention, the step reducing material reducing a difference in level between the barrier metal layer and the first conductive layer is formed on the upper surface of the barrier metal layer in the through-hole. Therefore, the depth of an opening region surrounded by the upper surface of the barrier metal layer, the upper surface of the first conductive layer and the sidewall of the through-hole becomes nil or can be reduced. That is, even if the upper conductive layer is formed by the sputtering, the volume of void (31 in FIG. 12) under the upper conductive layer becomes nil or can be smaller. In case there is no void, the connection between the upper conductive layer and the first conductive layer is not broken even through the process involving heat treatment after the formation of the upper conductive layer. Even with the void, since the volume of the void is smaller than the conventional one, the possibility of breaking the connection between the upper conductive layer and the first conductive layer due to the expansion of the air in the void can be reduced even through the process involving heat treatment after the formation of the upper conductive layer.

According to the second aspect of the present invention, a layer of material is formed on the upper main surface of the first conductive layer and the upper main surface of the barrier metal layer in the through-hole. Therefore, a difference in level between the barrier metal layer and the first conductive layer can be reduced.

According to the third aspect of the present invention, the action of the above-described first aspect can be performed, since the step reducing material reducing a difference in level between the barrier metal layer and the first conductive layer is formed on the upper surface of the barrier metal layer in the through-hole.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (A first embodiment)

Figure 1:
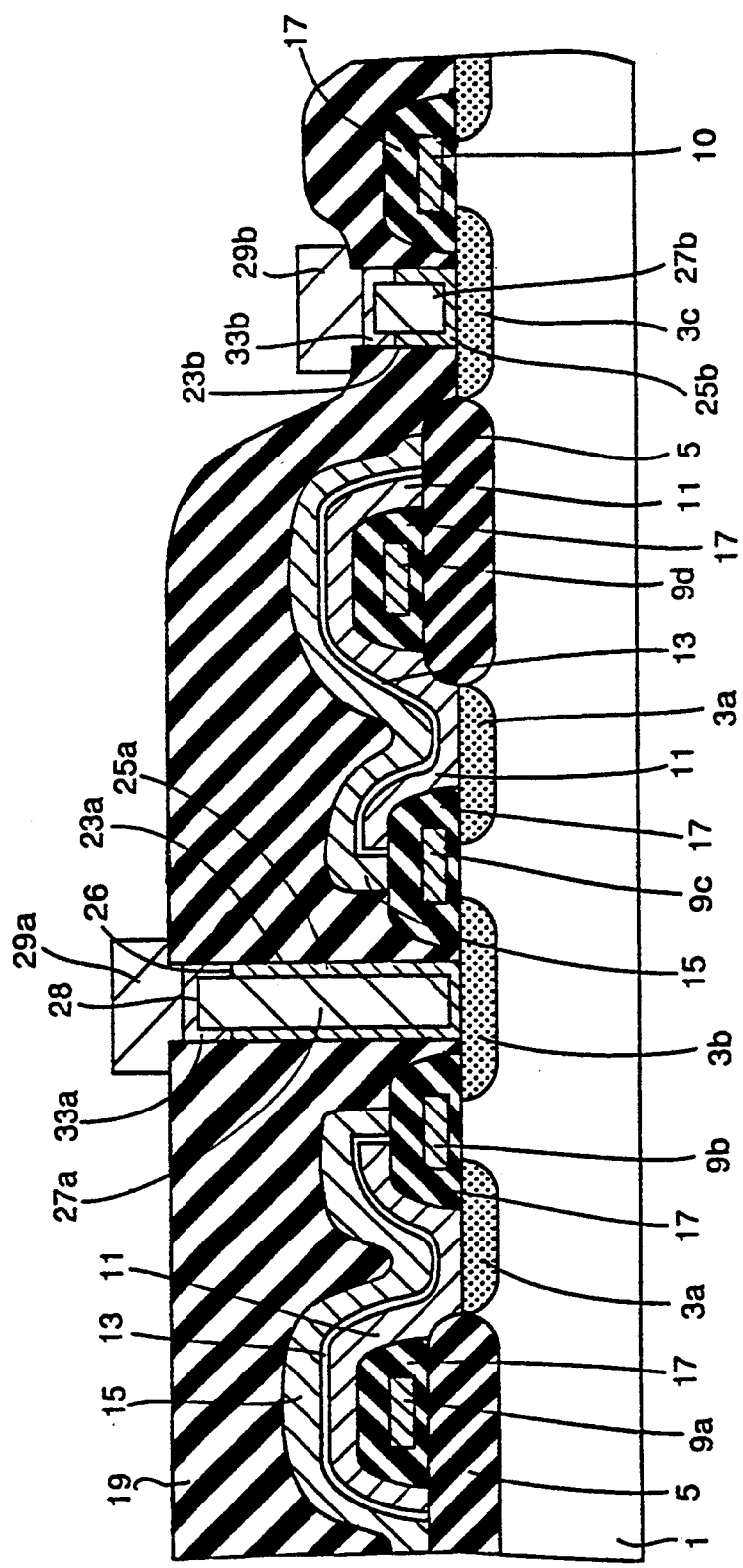
FIG. 1 is a diagrammatic sectional view of a first embodiment of the present invention.

FIG. 1 is a diagrammatic sectional view of a first embodiment of the present invention. This shows a DRAM. Impurity regions 3a, 3b and 3c are formed on a silicon substrate 1 at intervals. A silicon oxide film 19 having through-holes 23a and 23b is formed on silicon substrate 1. A barrier metal film 25a is formed on the side and the bottom surface of through-hole 23a, and through-hole 23b is similarly provided with a barrier metal film 25b. For example, TiN, TiW, NiCr, Ni, Cr, TiON, TiNW, Ta, MoSi, WSi and TiSi are employed as barrier metal films 25a and 25b available for the present invention. The thickness of barrier metal films 25a and 25b is in the order of 1000 Å.

In through-holes 23a and 23b, tungsten films 27a and 27b are embedded. A conductive material other than tungsten is also available if the formation by the CVD method can be achieved. An opening region formed by an upper surface 28 of tungsten film 27a, an upper surface 26 of barrier metal film 25a and the sidewall of through-hole 23a is filled with a tungsten film 33a. Other conductive materials which can be formed by the CVD method, for example, a high melting point refractory metal like Ti, Cr, Mo and TiN, instead of tungsten film 33a are also available. 33b is a tungsten film. Aluminum films 29a and 29b are formed on 33a and 33b, respectively.

A storage node 11 is in an electric connection with impurity region 3a. A dielectric film 13 is formed on storage node 11. A cell plate 15 is formed on dielectric film 13. Word lines 9a, 9b, 9c, 9d, and a gate electrode line 10 are formed on silicon substrate 1 at intervals. 5 denotes a field oxide film. 17 denotes a silicon oxide film. A word line 9 is formed on a field oxide film 5 and covered with silicon oxide film 17. A manufacturing method of the first embodiment of the present invention will now be described hereinafter.

Figure 2:
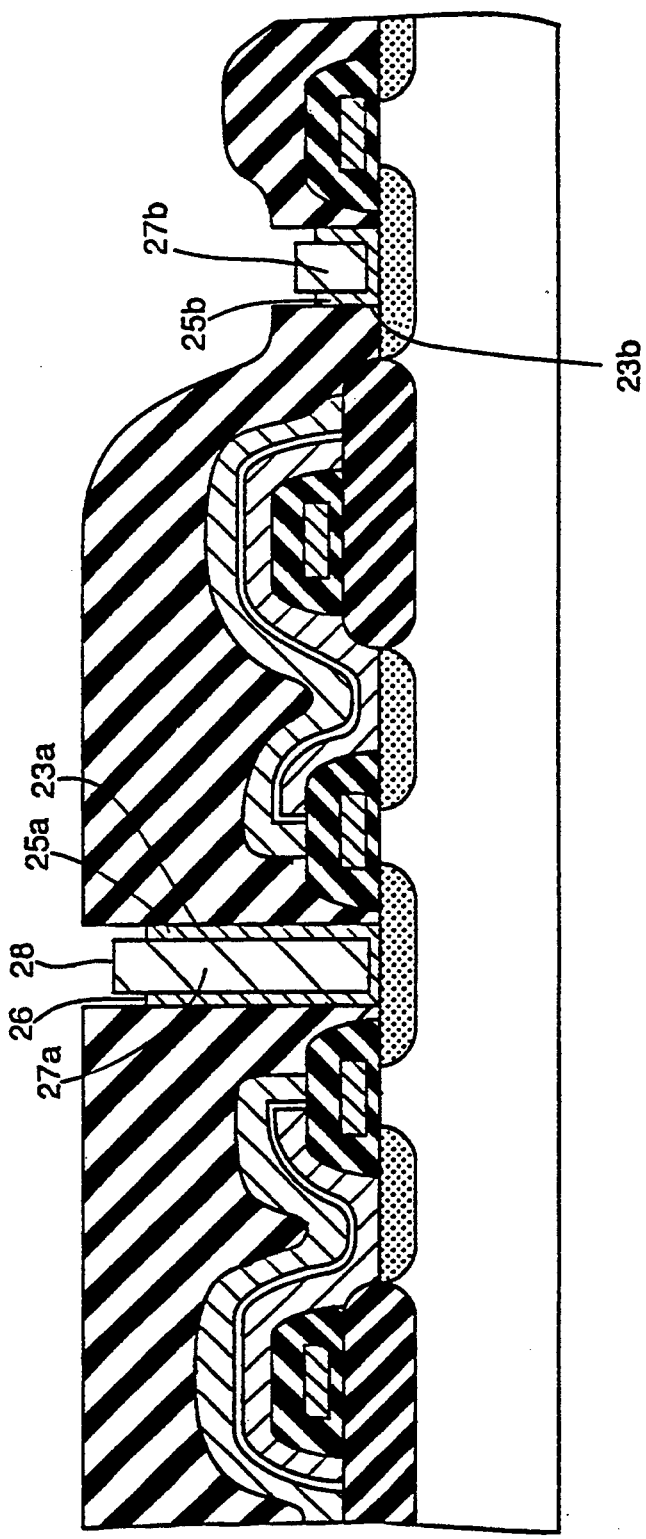
FIGS. 2 to 6 are sectional views of a silicon substrate showing first to fifth steps of a manufacturing process of the first embodiment of the present invention.
Figure 3:
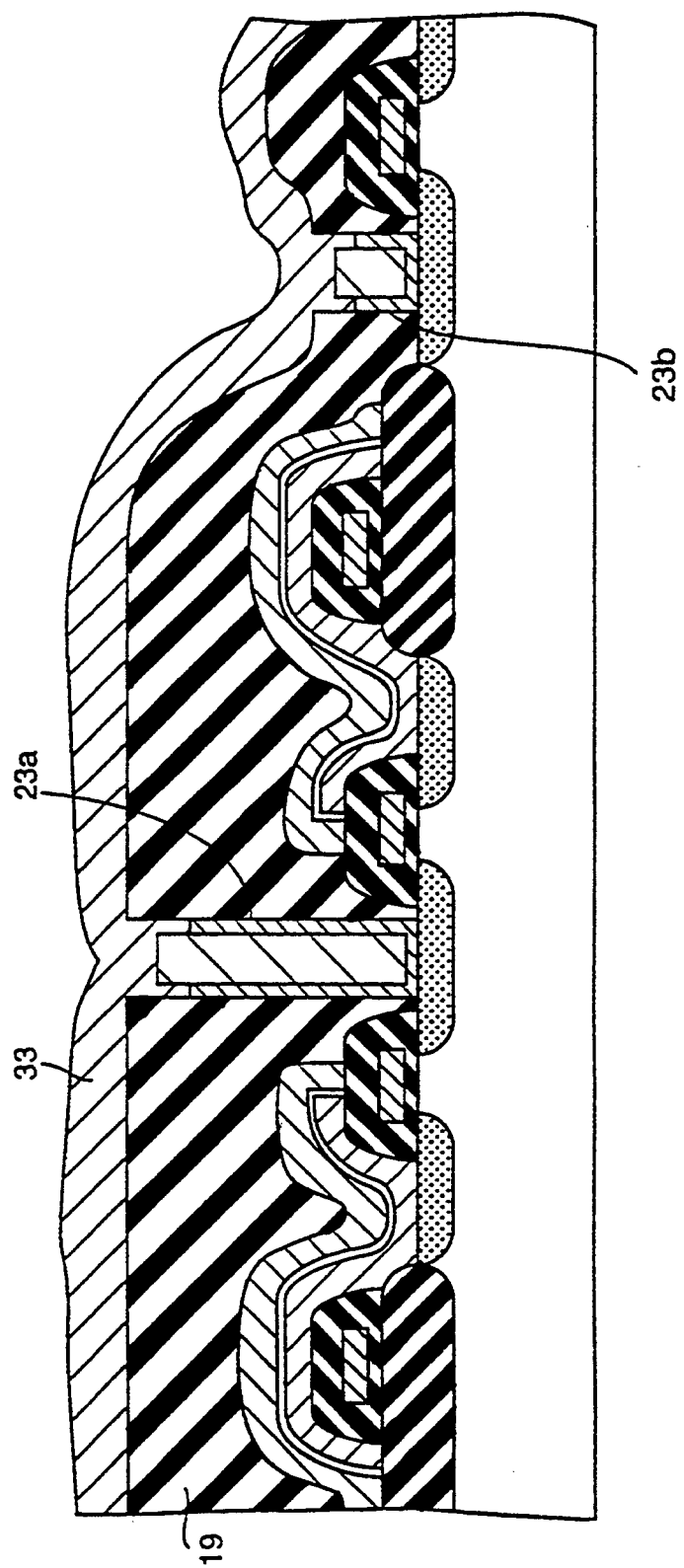
Figure 4:
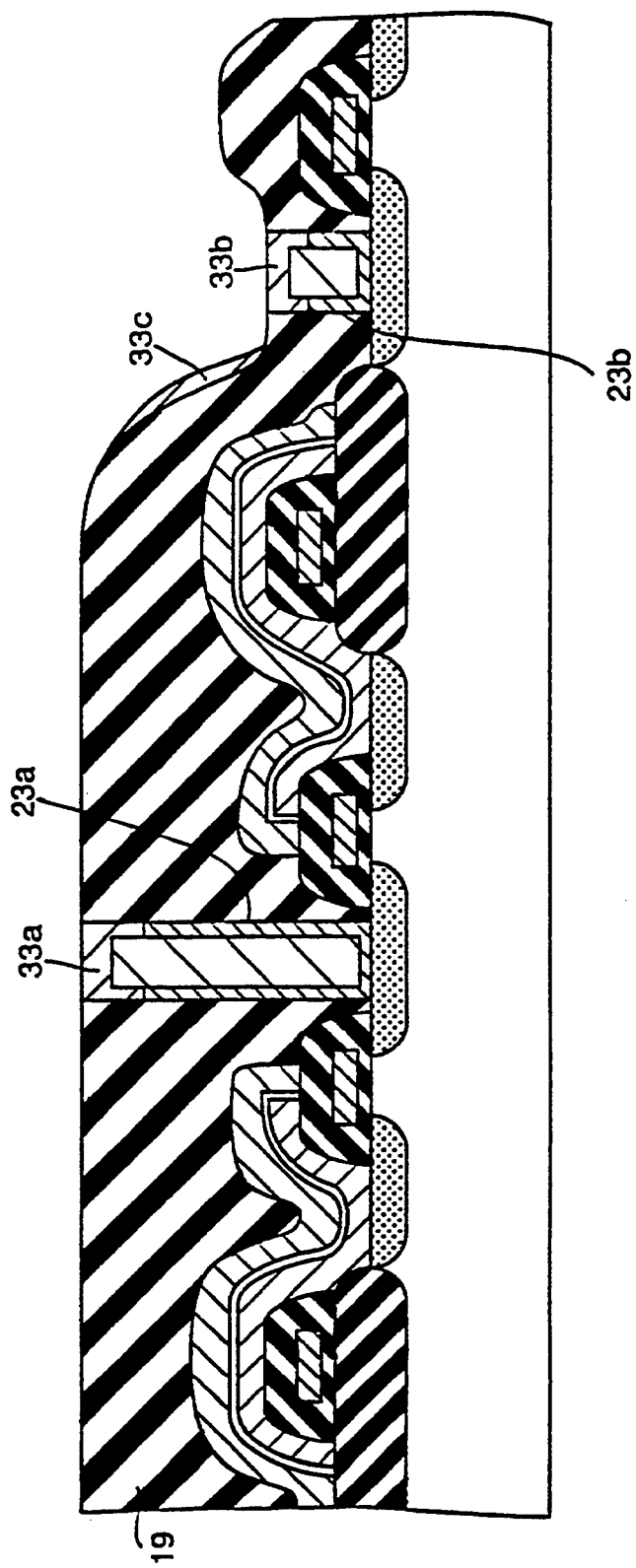

The steps leading to the structure shown in FIG. 2, that is, FIGS. 13 to 18 are the same as those of the conventional case. FIG. 2 corresponds to FIG. 18. A tungsten film 33 has been formed by using the CVD method as shown in FIG. 3 for filling the opening region formed by upper surface 28 of tungsten film 27a, upper surface 26 of barrier metal film 25a and the sidewall of through-hole 23a. The entire surface of tungsten film 33 is etched to expose the surface of silicon oxide film 19 as shown in FIG. 4. Tungsten films 33 in through-holes 23a and 23b are hereinafter referred to as tungsten films 33a and 33b, respectively. 33c is also a tungsten film. Tungsten film 33c is generated in the same way as tungsten film 27c (See FIG. 15) and barrier metal film 25c (See FIG. 17) described in the conventional examples.

Figure 5:
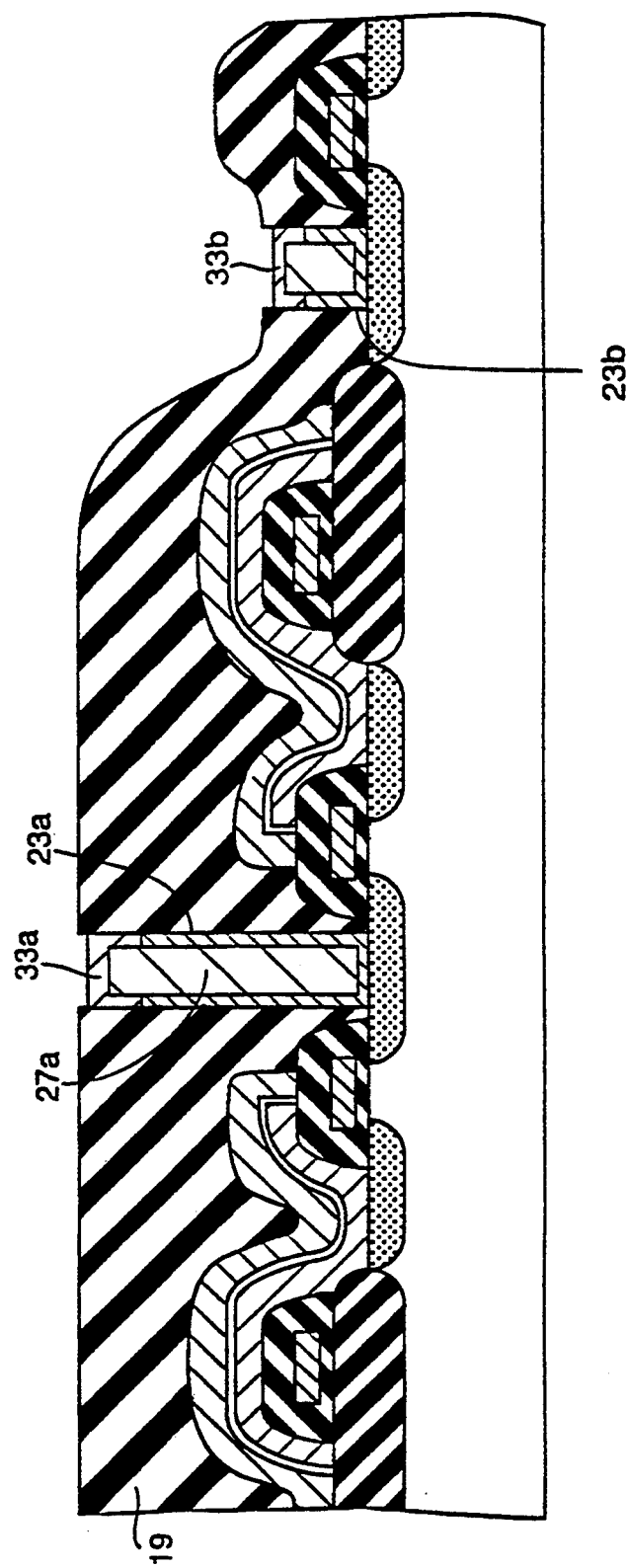
Figure 6:
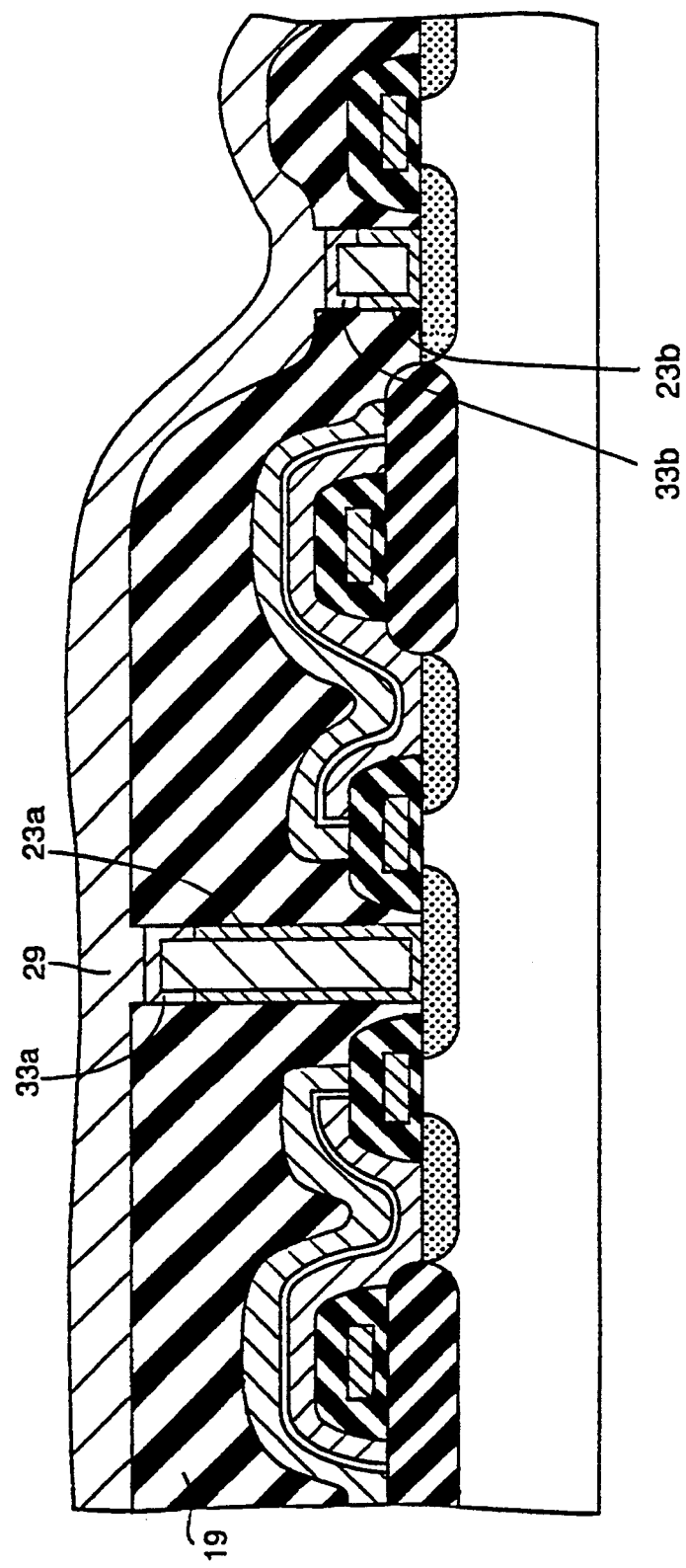

Tungsten films 33a, 33b and 33c have been further etched to remove tungsten film 33c as shown in FIG. 5. Due to a conductivity of tungsten film 33a, it can be etched until the upper surface of tungsten film 27a is exposed. Then, as shown in FIG. 6, aluminum film 29 is formed on silicon oxide film 19 using the sputtering method. FIG. 1 shows a state of forming aluminum films 29a and 29b by effecting a predetermined patterning to aluminum film 29.

(A second embodiment)

The same steps as those of FIGS. 13 to 18 are applied to this embodiment.

Figure 7:
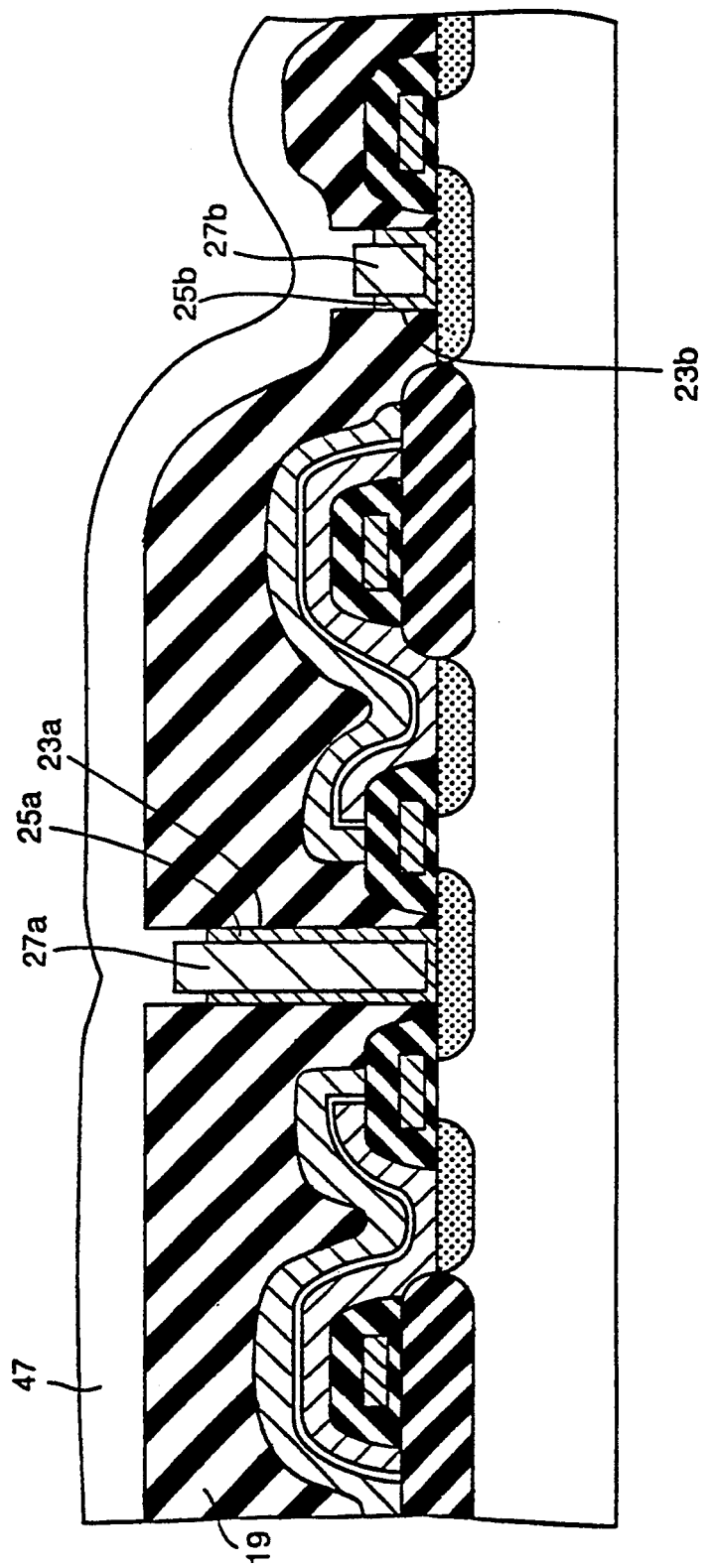
FIGS. 7 to 9 are sectional views of the silicon substrate showing first to third steps of the manufacturing process of the second embodiment of the invention.
Figure 8:
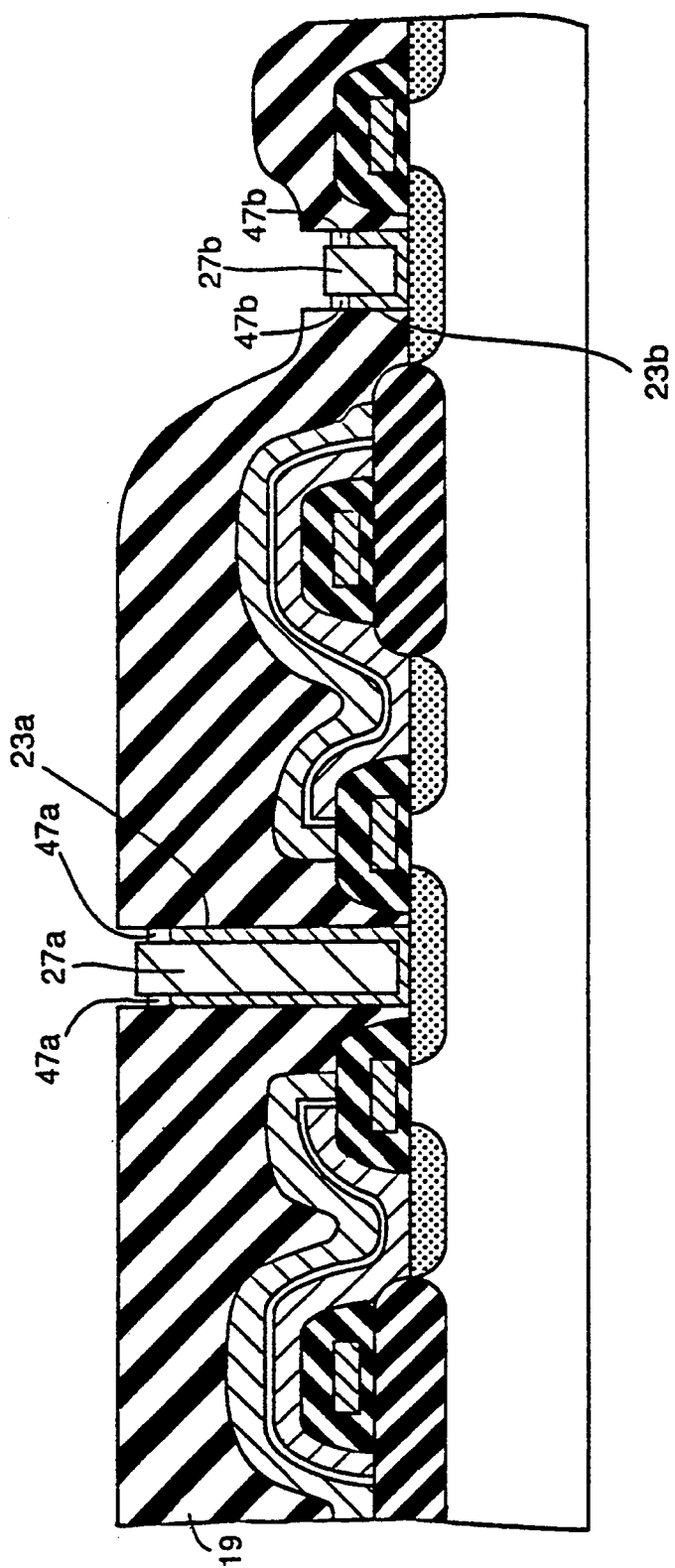

In the second embodiment, an opening region formed by upper surface 28 of tungsten film 27a, upper surface 26 of barrier metal film 25a and the sidewall of through-hole 23a is filled with a silicon oxide film 47 formed by the CVD method as shown in FIG. 7. Silicon oxide film 47 is overall etched to remove silicon oxide film 47 on silicon oxide film 19, as shown in FIG. 8. Silicon oxide film 47 in through-holes 23a and 23b is referred to as silicon oxide films 47a and 47b, respectively. Since silicon oxide films 47a and 47b are insulating films, silicon oxide films 47 are etched to expose the upper surfaces of tungsten films 27a and 27b.

Figure 9:
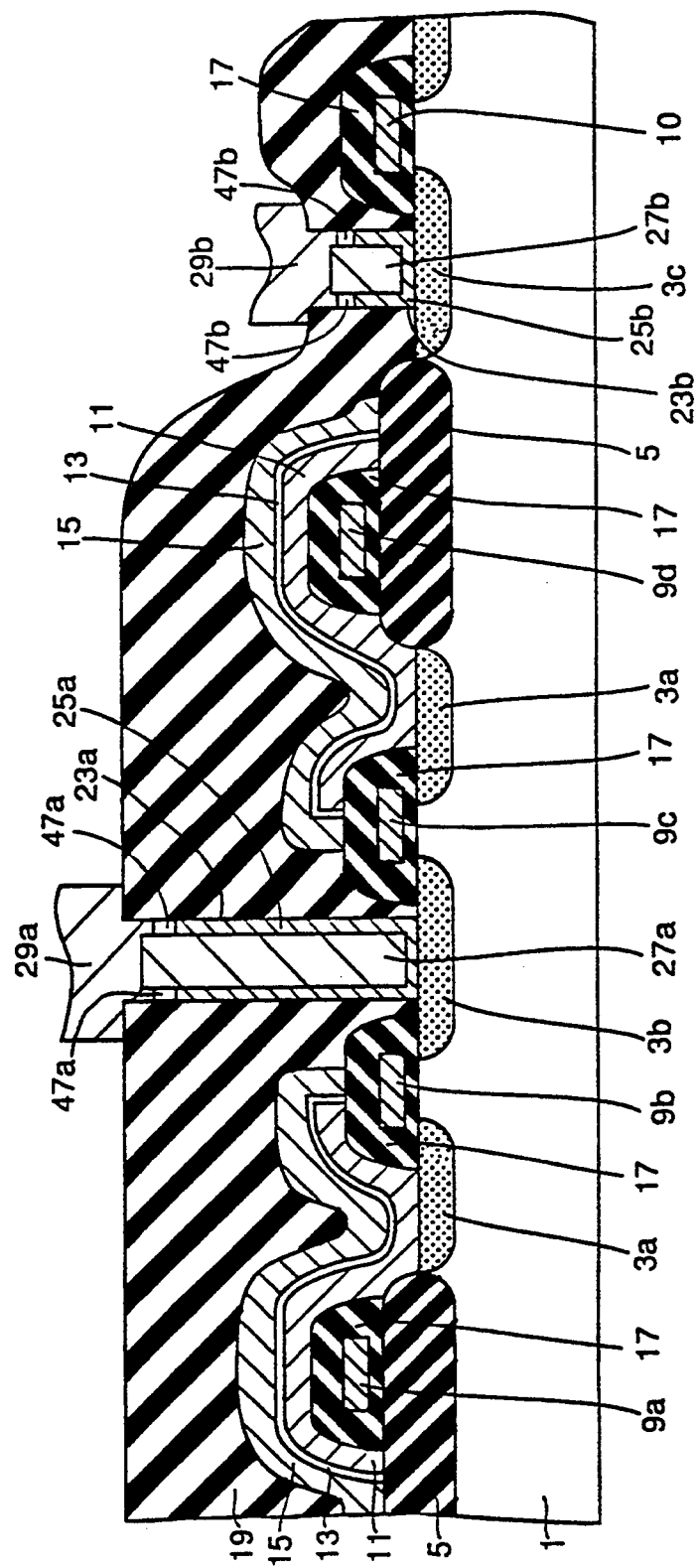
Figure 10:
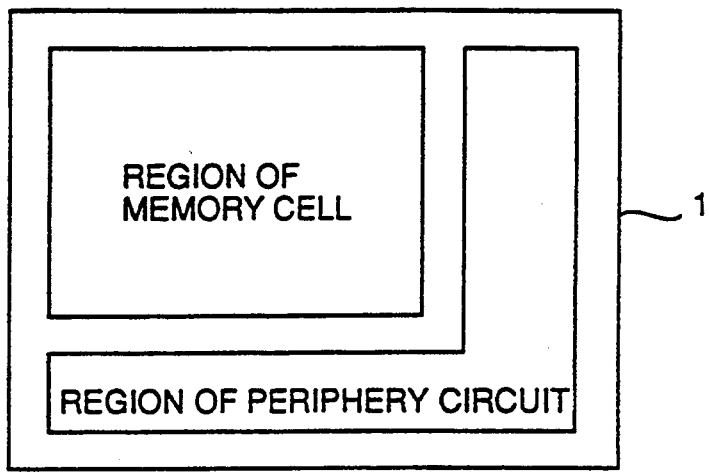
FIG. 10 is a block diagram showing a conventional semiconductor memory device.
Figure 11:
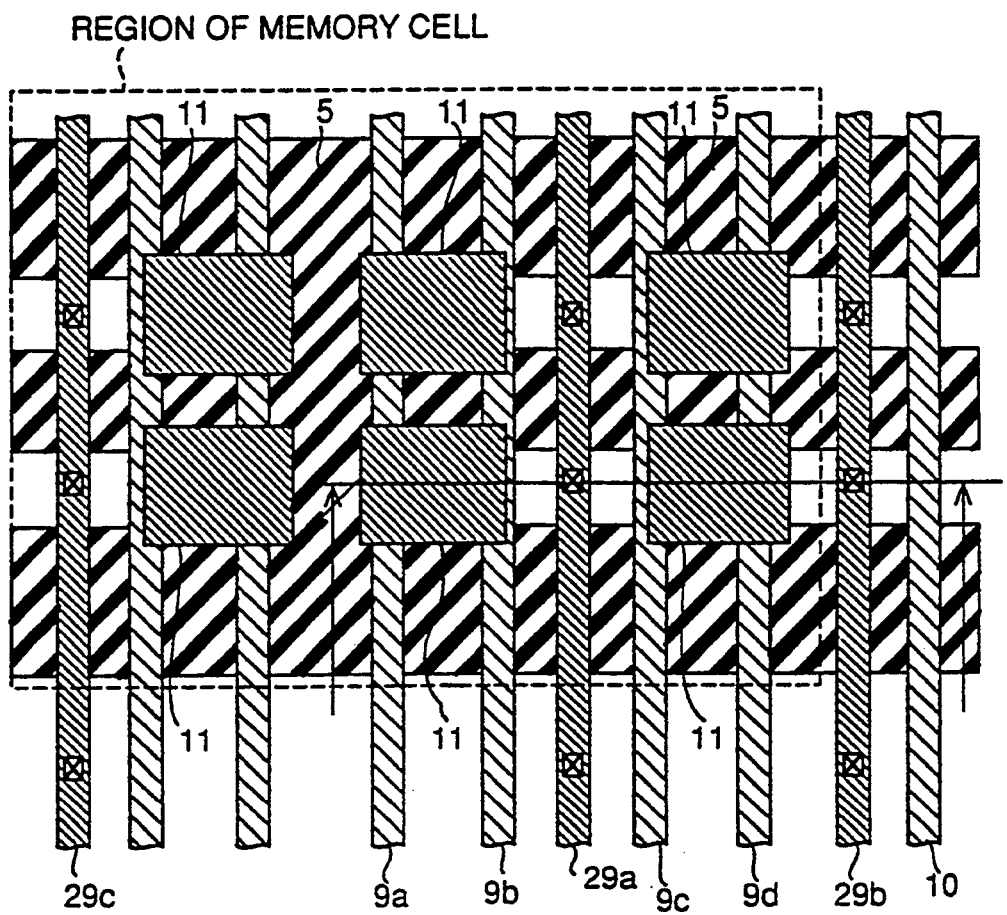
FIG. 11 is an enlarged plan view of the semiconductor memory device shown in FIG. 10.
Figure 12:
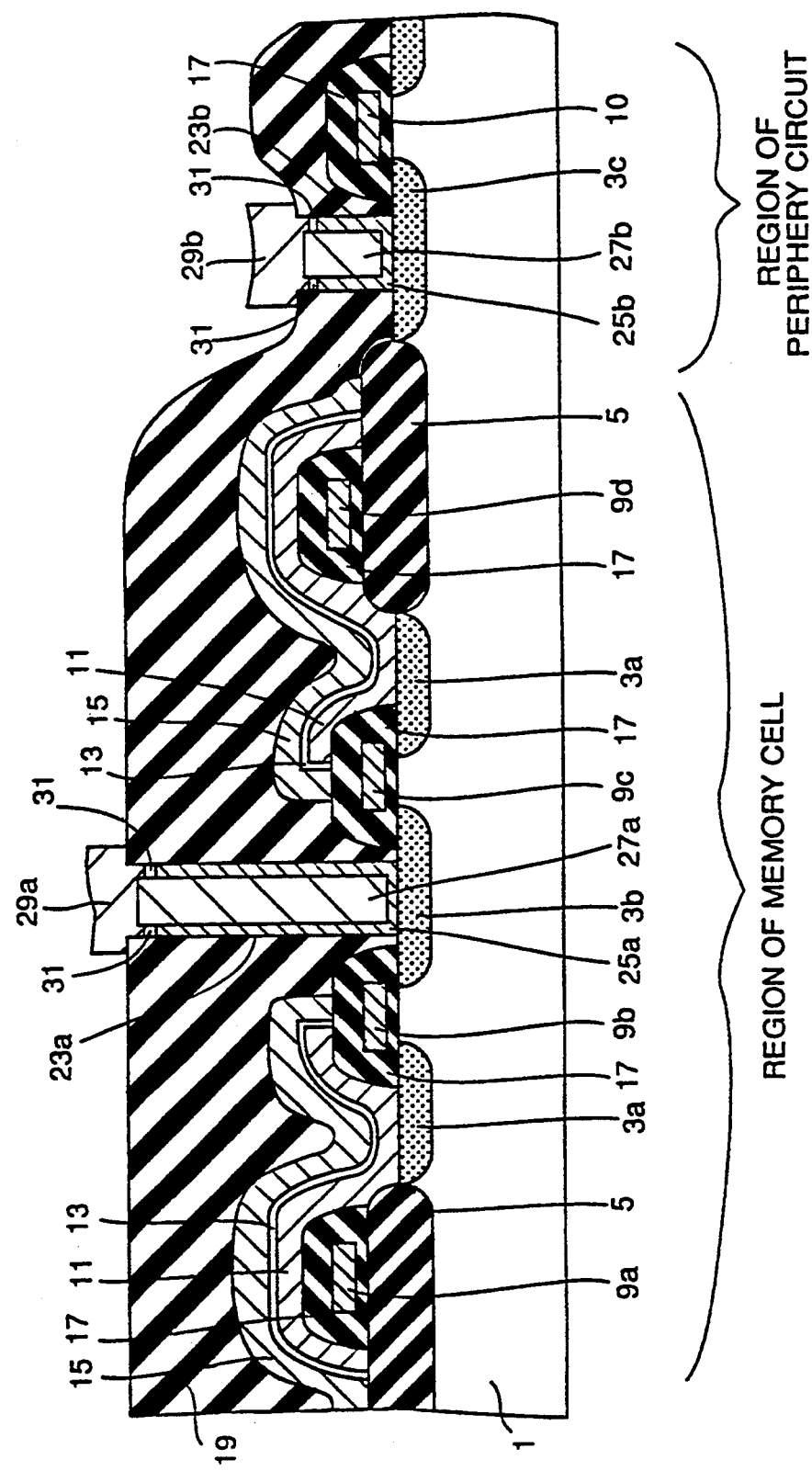
FIG. 12 is a sectional view taken along the line indicated by an arrow in FIG. 11.
Figure 13:
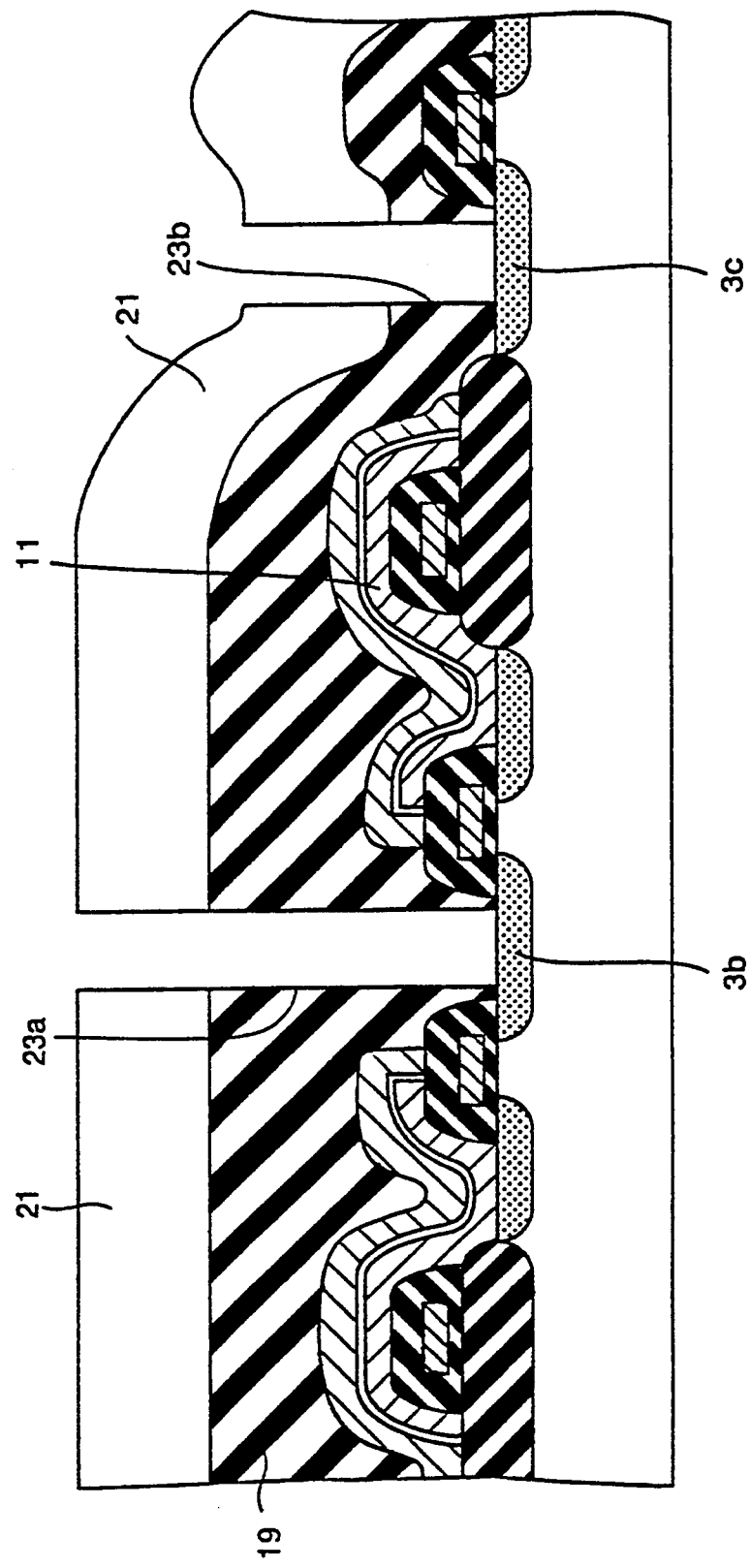
FIGS. 13 to 19 are sectional views of the silicon substrate showing first to seventh steps of a manufacturing method of a conventional DRAM.
Figure 14:
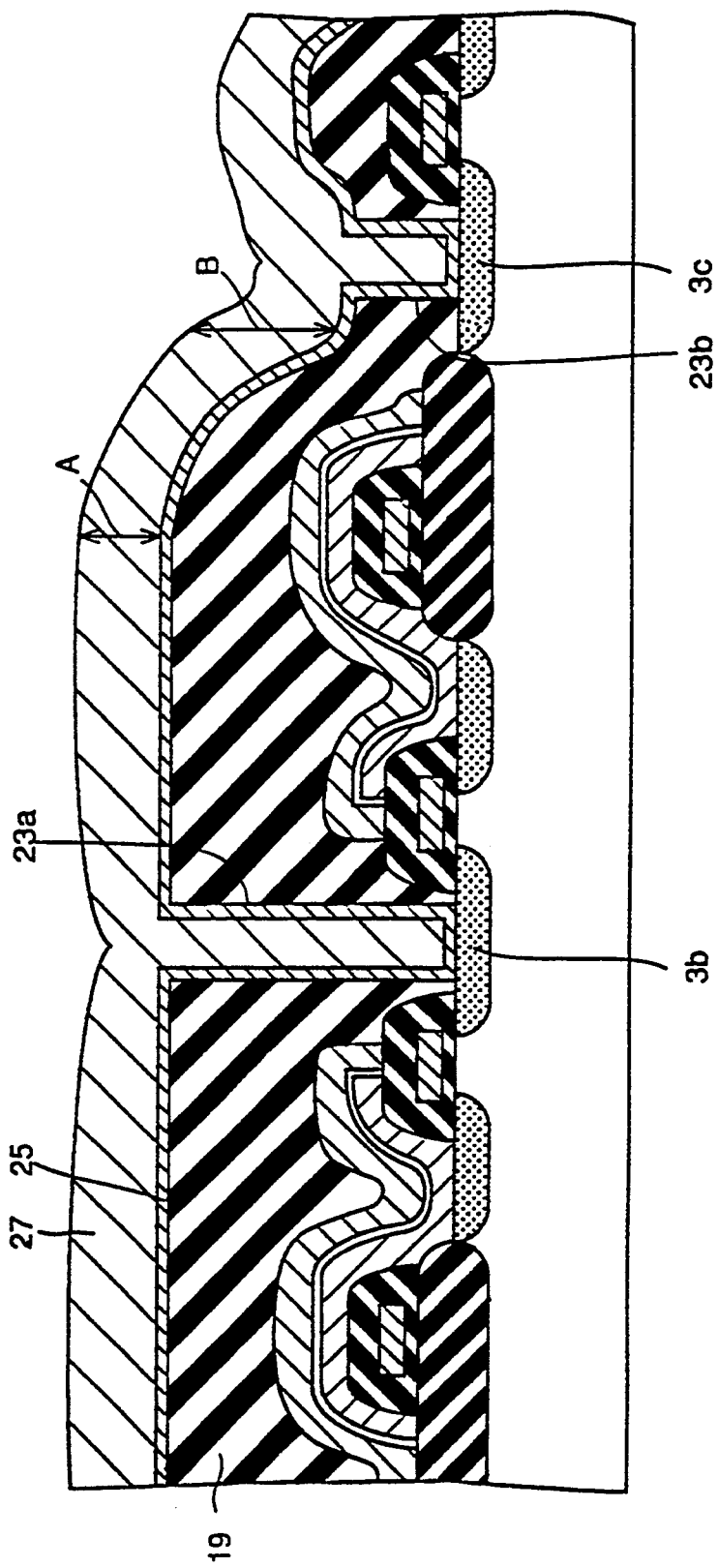
Figure 15:
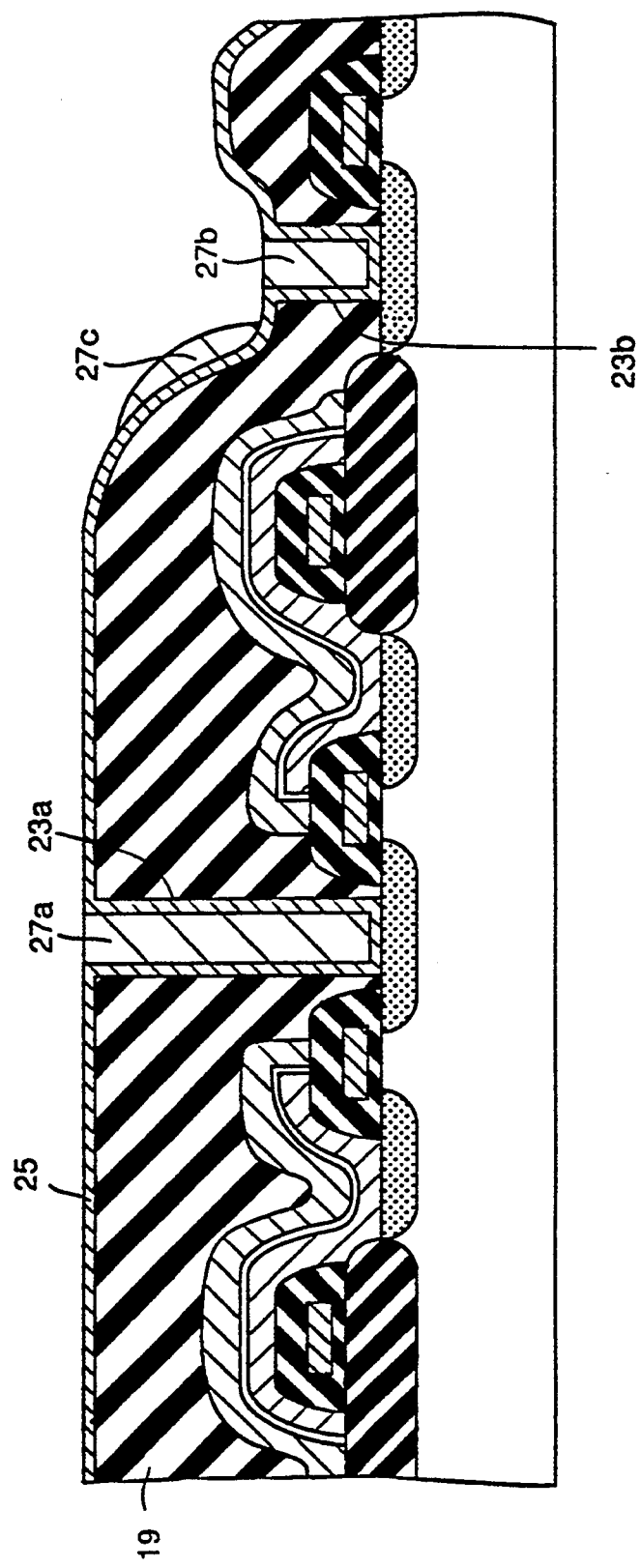
Figure 16:
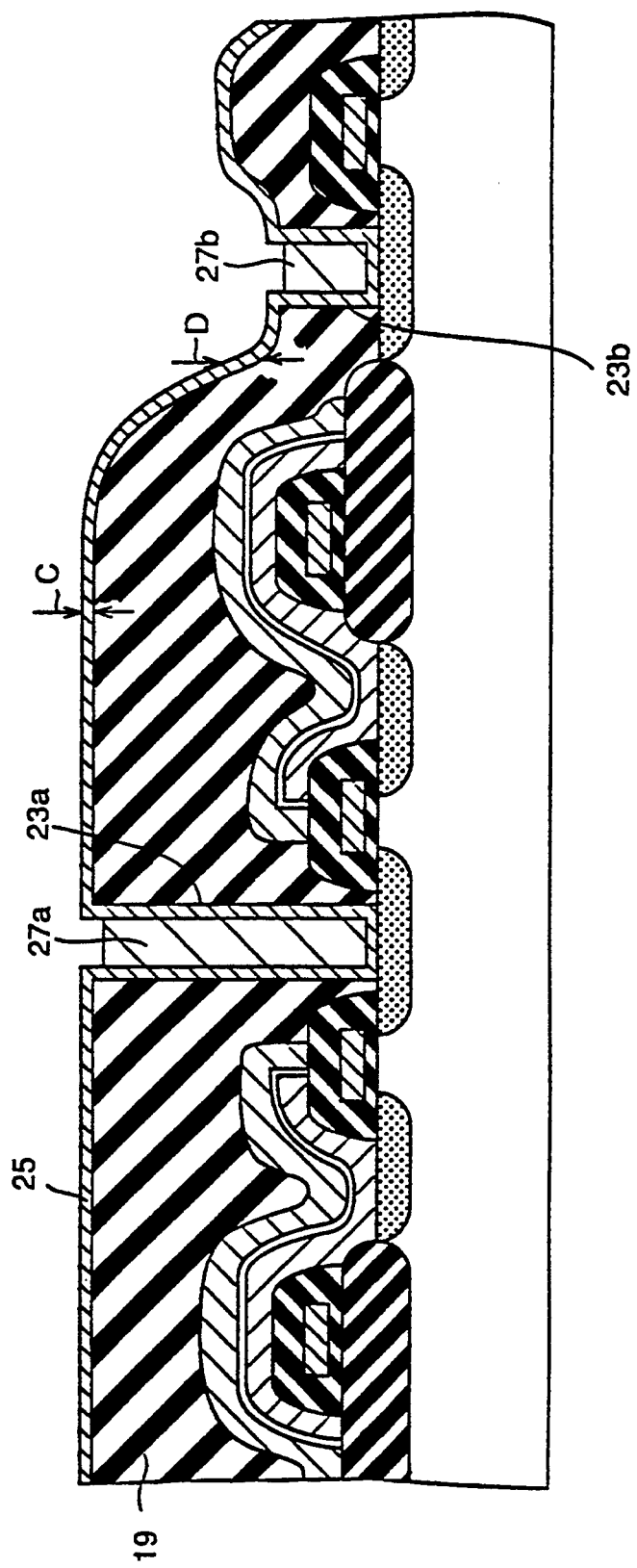
Figure 17:
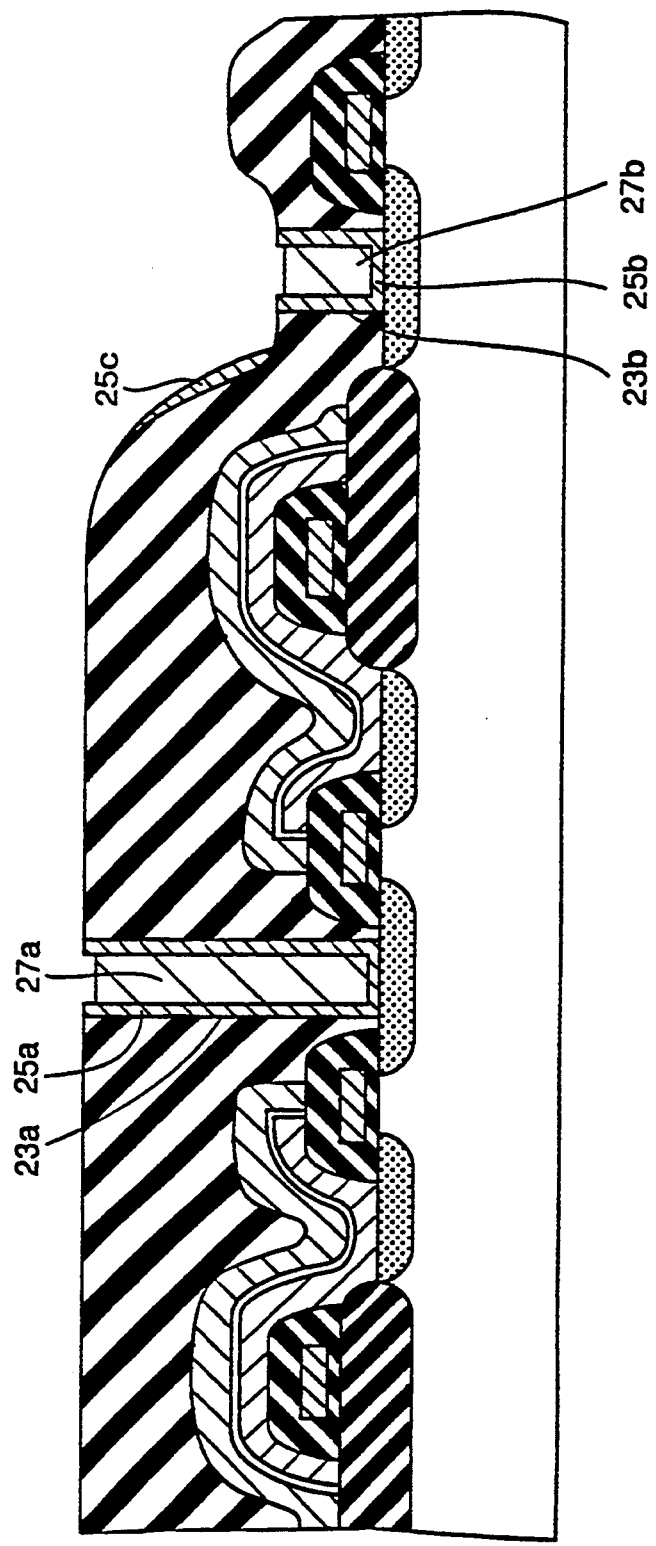
Figure 18:
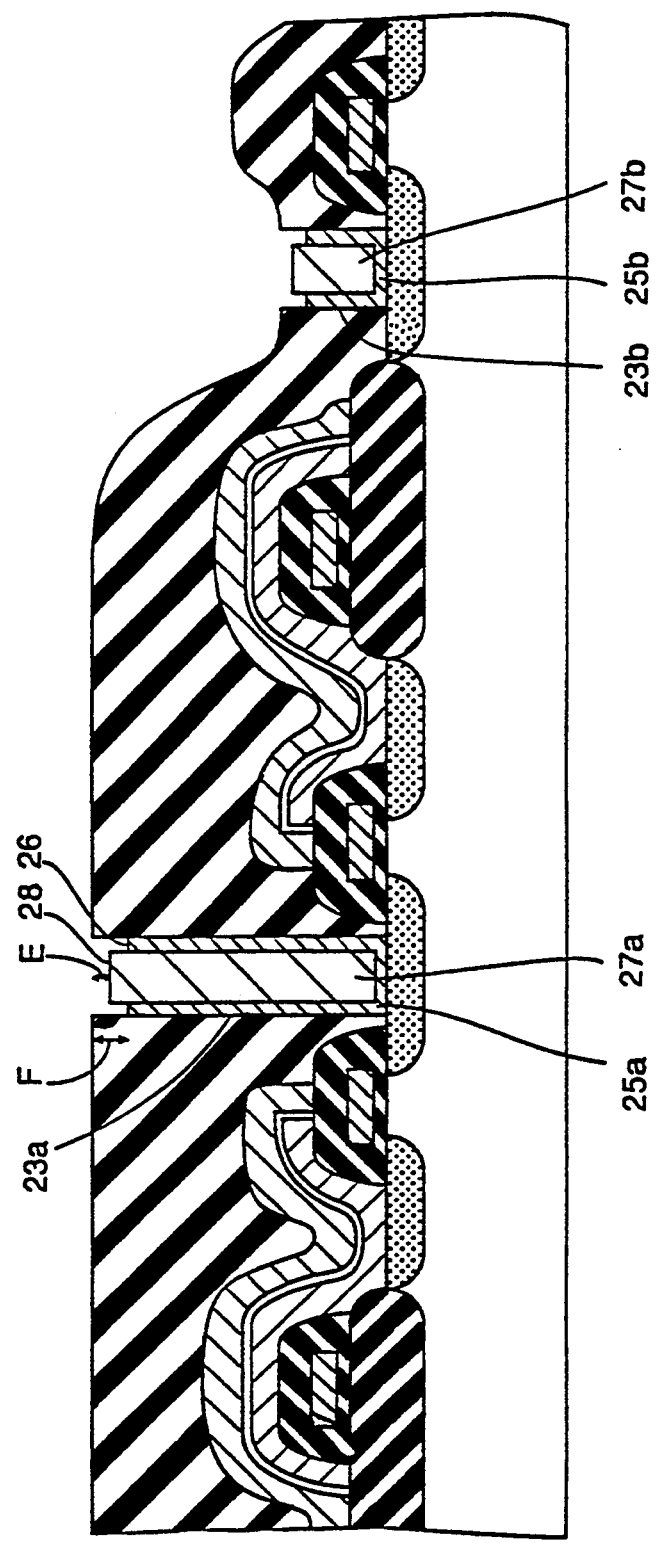
Figure 19:
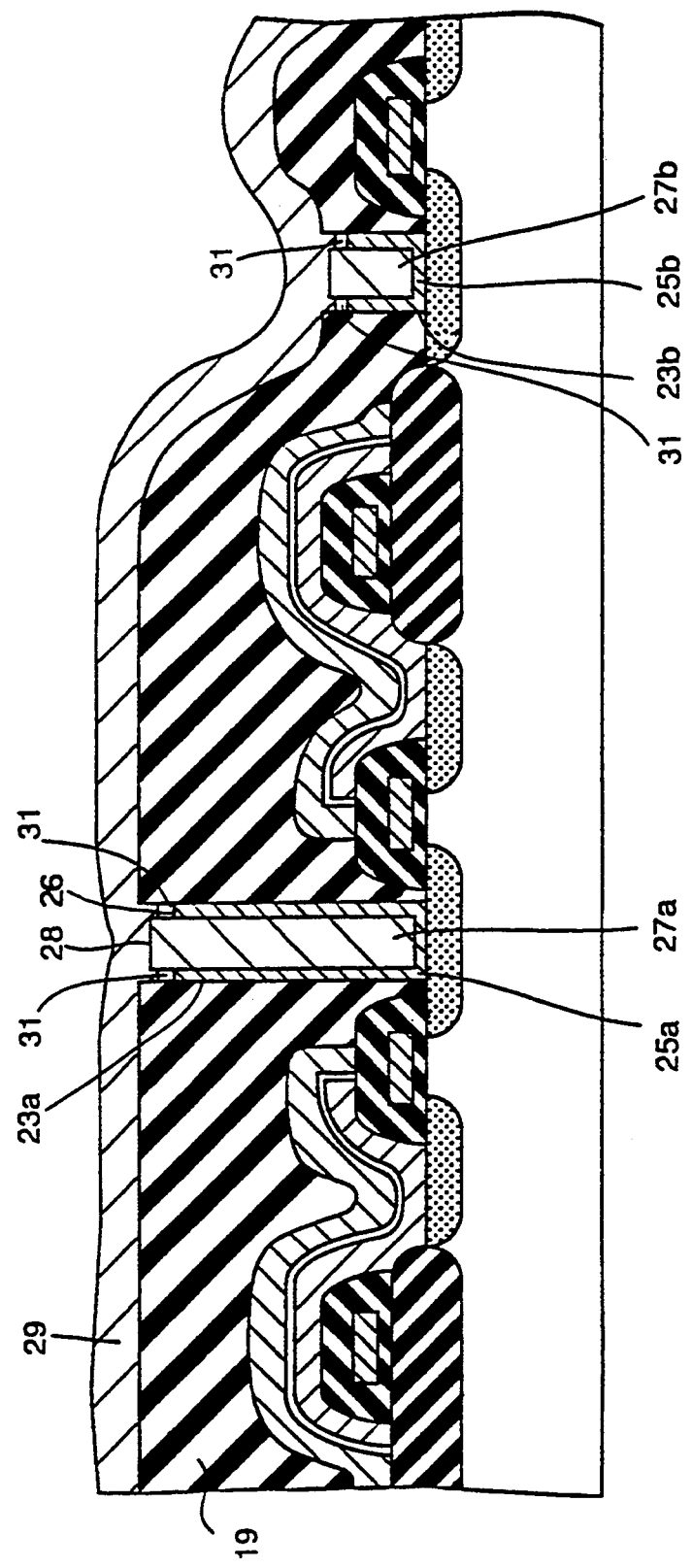
Figure 20:
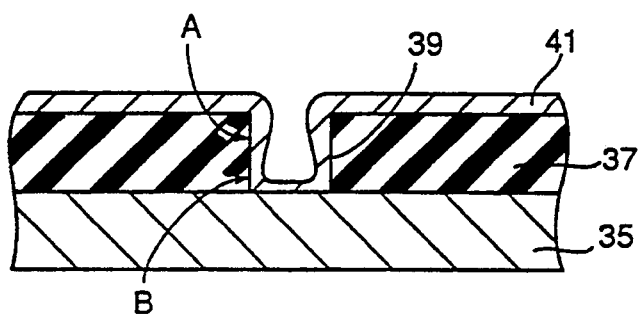
FIG. 20 is a diagram showing a first state of the formation of an upper conductive layer by using a sputtering method.
Figure 21:
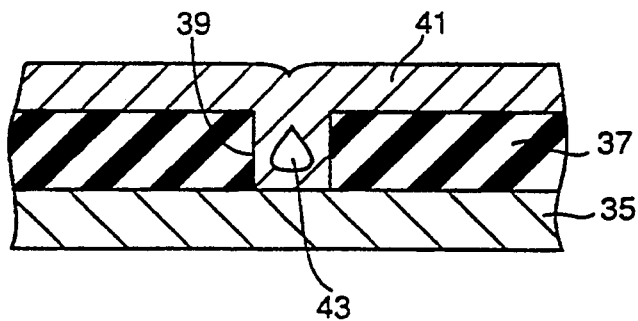
FIG. 21 is a diagram showing a second state of the formation of the upper conductive layer by using the sputtering method.
Figure 22:
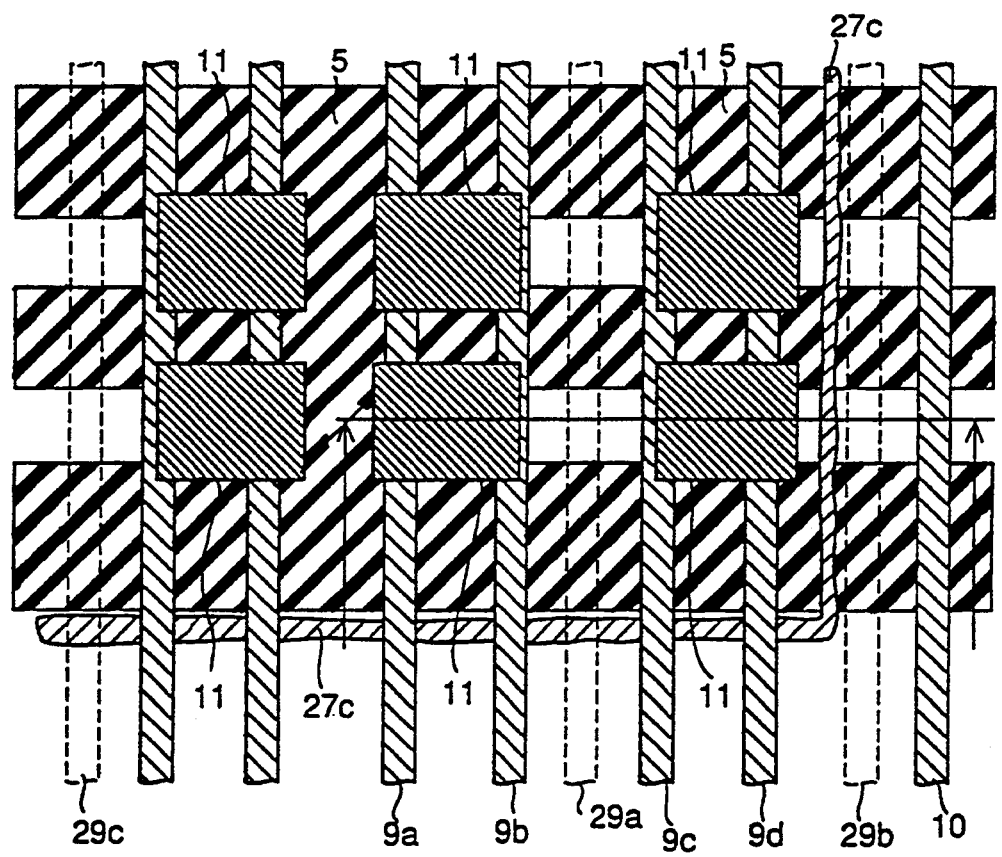
FIG. 22 is an enlarged plan view of the semiconductor memory device with a tungsten film 27c being left.
Figure 23:
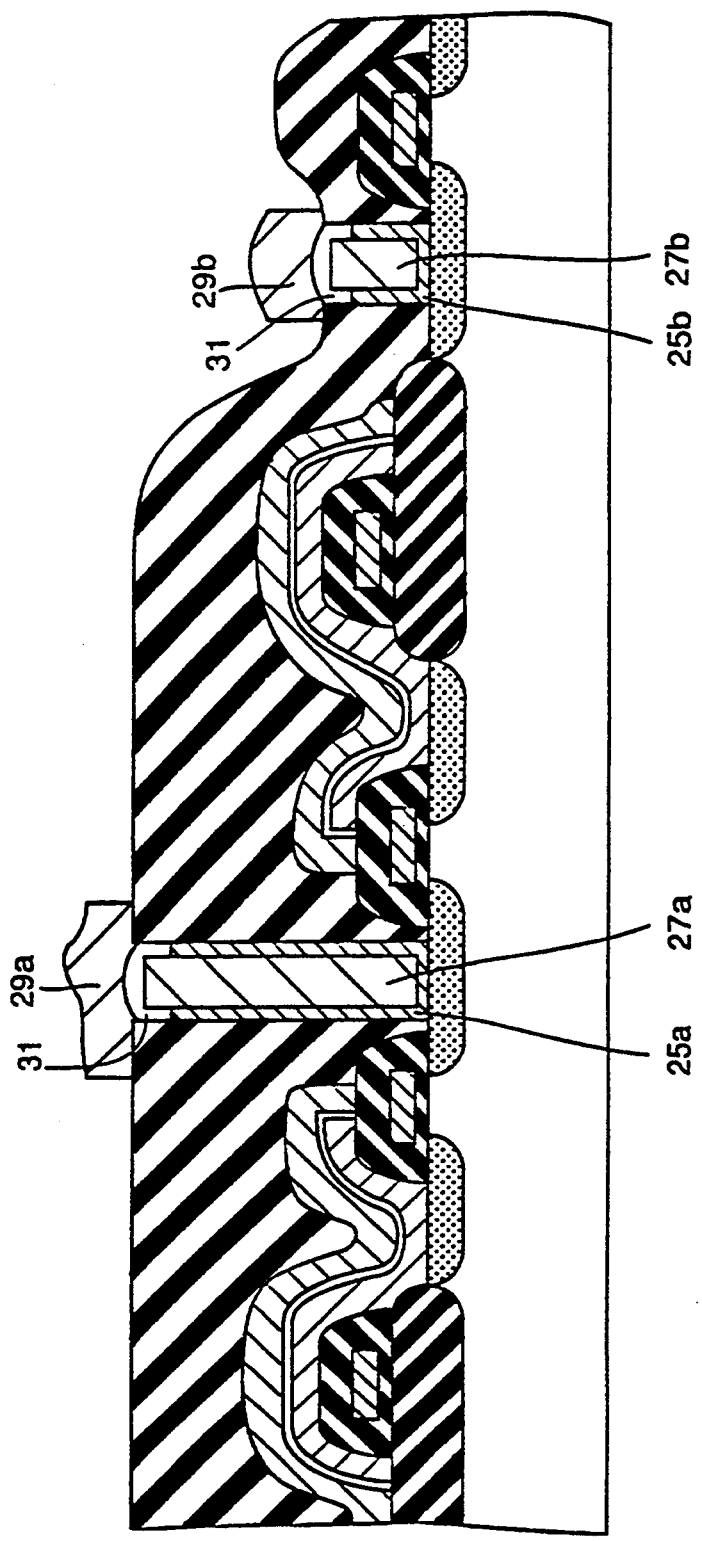
FIG. 23 is a sectional view of the silicon substrate with the connection between an aluminum film 29a and a tungsten film 27a being broken.

The aluminum film is formed on silicon oxide film 19 by the sputtering method, and the predetermined patterning is effected thereon, as shown in FIG. 9. The same reference characters as in FIG. 1 indicate the corresponding parts thereof.

Though the first and second embodiments show the cases where the present invention is applied to the DRAM, the present invention has applicability to a microcomputer, EPROM (Erasable Programmable Read-Only Memory) or the like.

In the first aspect of the present invention, the step reducing material reducing a difference in level between the barrier metal layer and the first conductive layer is formed on the upper surface of the barrier metal layer in the through-hole prior to the formation of the upper conductive layer which is in an electric connection with the first conductive layer. Therefore, the depth of the opening region formed by the upper surface of the barrier metal layer, the upper surface of the first conductive layer and the sidewall of the through-hole becomes nil or can be made smaller. Thus, the connection between the first conductive layer and the upper conductive layer cannot be broken even through the step involving heat treatment after the formation of the upper conductive layer.

Since the step reducing material formed on the upper surface of the barrier metal layer in the through-hole for reducing a difference in level between the barrier metal layer and the first conductive layer is provided for the third aspect of the present invention, the connection between the upper conductive layer and the first conductive layer cannot be separated even through the step involving heat treatment after the formation of the upper conductive layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A conductive layer connection structure of a semiconductor device electrically interconnecting an upper conductive layer and a lower conductive layer, comprising:

an insulating layer formed on said lower conductive layer and having an upper main surface and a through-hole extending from said upper main surface to said lower conductive layer;

a first conductive layer embedded in said through-hole and electrically connecting said upper conductive layer and said lower conductive layer;

a barrier metal layer formed between the sidewall of said through-hole and said first conductive layer, and between a main surface of said lower conductive layer and a lower surface of said first conductive layer, an upper surface of said barrier metal layer in said through-hole being positioned lower from said upper main surface of said insulating layer than an upper surface of said first conductive layer; and.

a step reducing structure formed on the upper surface of said barrier metal layer in said through-hole for reducing a difference in level from said upper main surface of said insulating layer between said upper surface of said barrier metal layer and said upper surface of said first conductive layer;

wherein said first conductive layer, said barrier metal layer and said step reducing structure are different materials, respectively and said step reducing structure is formed on the exposed upper surface of said first conductive layer.

2. The conductive layer connection structure of the semiconductor device according to claim 1, wherein said step reducing structure is electrically conductive and coats said first conductive layer.

3. The conductive layer connection structure of the semiconductor device according to claim 2, wherein said step reducing structure is a high melting point refractory metal film.

4. The conductive layer connection structure of the semiconductor device according to claim 1, wherein said step reducing structure is a high melting point refractory metal film.

5. The conductive layer connection structure of the semiconductor device according to claim 1, wherein said first conductive layer constitutes a part of a bit line of a DRAM.

6. The conductive layer connection structure of the semiconductor device according to claim 1, wherein said step reducing structure comprises an insulating film.

7. The conductive layer connection structure of the semiconductor device according to claim 1, wherein said step reducing structure comprises a high melting point refractory metal film and an insulating film.

* * * * *